United States Patent [19]

Bernards et al.

[11] Patent Number: 5,051,154
[45] Date of Patent: * Sep. 24, 1991

[54] ADDITIVE FOR ACID-COPPER ELECTROPLATING BATHS TO INCREASE THROWING POWER

[75] Inventors: Roger F. Bernards, Wellesley; Gordon Fisher, Sudbury; Wade Sonnenberg, Foxboro; Edward J. Cerwonka, Woburn; Stewart Fisher, Sudbury, all of Mass.

[73] Assignee: Shipley Company Inc., Newton, Mass.

[ * ] Notice: The portion of the term of this patent subsequent to Jan. 30, 2007 has been disclaimed.

[21] Appl. No.: 471,381

[22] Filed: Jan. 29, 1990

Related U.S. Application Data

[63] Continuation-in-part of Ser. No. 235,051, Aug. 23, 1988, Pat. No. 4,897,165.

[51] Int. Cl.$^5$ ................................................. C25D 3/38
[52] U.S. Cl. ........................................ 204/24; 204/52.1
[58] Field of Search .................................. 204/52.1, 24

[56] References Cited

U.S. PATENT DOCUMENTS

| | | | |
|---|---|---|---|
| 3,674,660 | 7/1972 | Lyde | 204/52.1 |
| 3,769,179 | 10/1973 | DuRose et al. | 204/24 |
| 4,347,108 | 8/1982 | Willis | 204/52.1 |
| 4,376,685 | 3/1983 | Watson | 204/52.1 |
| 4,384,930 | 5/1983 | Eckles | 204/52.1 X |
| 4,419,192 | 12/1983 | Dahms | 204/52.1 X |
| 4,512,007 | 4/1985 | Knothe et al. | 204/52.1 X |
| 4,555,315 | 11/1985 | Barbieri et al. | 204/52.1 |
| 4,673,469 | 6/1987 | Beach et al. | 204/52.1 X |
| 4,683,036 | 7/1990 | Morrissey et al. | 204/15 |
| 4,897,165 | 1/1990 | Bernards et al. | 204/24 |

FOREIGN PATENT DOCUMENTS 1214069 4/1966 Fed. Rep. of Germany .
44930 4/1975 Japan .

OTHER PUBLICATIONS

P. Bindra et al., IBM Technical Disclosure Bulletin, vol. 26, No. 4, pp. 2173–2176, Sep. 1983.
Mayer et al.; "Characteristics of Acid Copper Sulfate Deposits for Printed Wiring Board Applications"; *Plating and Surface Finishing*, pp. 46–49, Mar. 1981.
Amadi, Sebastian I.; "Plating High Aspect Ratio Multilayer Boards"; *PC Fab*, pp. 85–94, Oct. 1987.
Malek, Thomas P.; "Acid Copper Plating of Printed Circuits"; *Product Finishing*, pp. 39–44, Mar. 1981.

*Primary Examiner*—John F. Niebling
*Assistant Examiner*—Isabelle R. McAndrews
*Attorney, Agent, or Firm*—Robert L. Goldberg

[57] ABSTRACT

The invention discloses the use of an additive for acid copper plating bath which is chosen based on criteria of creating a shift in the charge transfer overpotential of the bath; or alternatively, creating a differential overpotential between the surface of a high aspect ratio circuit board and the recesses of such boards. The additive may be a single or multi-component additive.

60 Claims, 3 Drawing Sheets

ADDITIVE FOR ACID-COPPER ELECTROPLATING BATHS TO INCREASE THROWING POWER

CROSS REFERENCE TO RELATED APPLICATIONS

This application is a continuation-in-part of copending U.S. Application Serial No. 07/235,051, filed Aug. 23, 1988, now U.S. Pat. No. 4,897,165 (hereafter the "copending patent").

BACKGROUND OF THE INVENTION

1. Introduction

This invention relates to an electrolytic plating solution used for uniformly depositing a metal coating on the walls of through-holes in multilayer printed circuit boards. In particular, the invention relates to an additive to the electrolytic plating solution which functions to increase the throwing power of the solution without sacrificing leveling or the ability of the deposit to resist thermal stress.

2. Description of the Prior Art

Methods for electroplating articles with metal coatings are well known in the art. Such methods involve passing a current between two electrodes in a plating solution where one of the electrodes is the article to be plated. An acid copper plating solution would comprise dissolved copper (usually copper sulfate), an acid electrolyte such as sulfuric acid in an amount sufficient to impart conductivity to the bath, and proprietary additives to improve the efficiency of the plating reaction and the quality of the metal deposit. Such additives include surfactants, brighteners, levelers, suppressants, etc.

Electrolytic copper plating solutions are used for many industrial applications. For example, they are used in the automotive industry as base layers for subsequently applied decorative and corrosion protective coatings. They are also used in the electronics industry, particularly for the fabrication of printed circuit boards. For circuit fabrication, copper is electroplated over selected portions of the surface of a printed circuit board and onto the walls of through-holes passing between the surfaces of the circuit board base material. The walls of a through-hole are metallized to provide conductivity between circuit layers on each surface of the board.

Early efforts to make circuit boards used electrolytic copper plating solutions developed for decorative plating. However, as printed circuit boards became more complex and as industry standards became more rigorous, solutions used for decorative plating were found to be inadequate for circuit board fabrication. A serious problem encountered using electrolytic copper plating solutions involved coatings of uneven thickness on the walls of the through-hole with the deposits thicker at the top and bottom of the holes and thinner at the center, a condition known in the art as "dog boning". The thin deposit at the center of the through-hole may lead to circuit defects and board rejection.

Dog boning is caused by a voltage drop between the top surface of the hole and the center of the hole. This potential drop is a function of current density, a ratio of the length of the hole to its diameter (aspect ratio) and board thickness. As the aspect ratio and the thickness of the board increase, dog boning becomes more severe due to a voltage drop between the surface of the board and the center of the through-hole. This voltage drop is caused by a combination of factors including solution resistance; a difference in surface to hole overpotential due to mass transfer—i.e., a difference in the flow of solution through the hole compared to the movement of the solution over the surface of the board; and a charge transfer difference as a consequence of the concentration of additives in the hole as compared to the surface.

The circuit board industry continuously seeks greater circuit densification. To increase density, the industry has resorted to multilayer circuits with through-holes or interconnections passing through multiple layers. Multilayer circuit fabrication results in an overall increase in the thickness of the board and a concomitant increase in the length of an interconnection passing through the board. This means that increased circuit densification results in increased aspect ratios and hole length and an increase in the severity of the dog boning problem. For high density boards, aspect ratios typically exceed ten to one.

The prior art, exemplified by Mayer and Barbien, "Characteristics of Acid Copper Sulfate Deposits for Printed Wiring Board Applications", *Plating and Surface Finishing*, pp. 46 to 49, March, 1981; Malak, "Acid Copper Plating of Printed Circuits", *Products Finishing*, pp. 38 to 44, March, 1981; and Amadi, "Plating High Aspect Ratio Multilayer Boards", *PC FAB*, pp. 85 to 94, October, 1987, all incorporated herein by reference, suggest that increasing the acid to metal ion ratio of an electrolytic plating solution improves plating solution throwing power and deposit distribution. The prior art teaches that the ratio may be altered by increasing acid concentration while holding metal ion concentration constant; or by decreasing metal ion concentration while holding acid concentration constant. The use of such methods to improve throwing power may lead to anode polarization with cessation of the plating reaction or decreased metal concentration which exacerbates the dog boning problem.

For a given set of chemical and physical conditions, the surface-to-hole ratio increases with increasing aspect ratio (board thickness divided by the hole diameter). For an aspect ratio of less than 3.0 and with a good plating additive, the effect is minimal and plating distribution in the hole is fairly uniform with the surface-to-hole ratio approaching 1.0. With increasing aspect ratio, both physical and chemical parameters must be optimized to obtain uniform plating in the holes. Copper plating additives may be used to optimize the plating. In Amadi, it is suggested that the additives may be multicomponent organic materials and that only the brightener and the carrier have been found to affect plating distribution in high aspect ratio multilayer boards. Amadi further suggests that increasing the carrier level improves the plating distribution in the holes but that there is also a critical concentration under which the brightener will not perform.

U.S. Pat. No. 4,683,036 describes a method for electroplating non-metallic surfaces of plating holes in metal clad laminates. The process involves use of a bath component which will cause preferential plating on two different metals. The present invention differs from the above patent in that preferential plating is not involved; and in the patent, although the component may aid in the initial coverage, once a thin layer of copper is plated, the system would no longer have sufficient resistance to continue the preferential plating.

Plating of thick, high aspect ratio through-hole boards is controlled by two fundamental areas of the process, fluid dynamics and electrochemistry. Fluid dynamics deals with the necessary to replenish metal ions in the hole. During plating of high aspect ratio holes, there must be sufficient exchange of metal ion depleted solution within the hole with fresh solution. Otherwise, the plating reaction in the hole will become strongly polarized causing the deposition rate there to slow relative to that on the surface. It has been shown that very small pressures are required to provide the necessary through hole agitation to ensure a nearly constant copper concentration in the hole and it is well known in the art that these pressures are easily attained using modest cathode movement.

The effect of the copper metal:sulfuric acid ratio has previously been discussed in the copending patent (U.S. Pat. No. 4,897,165). The patent discloses the use of a high molecular weight surfactant in an optimized acid-copper bath, which improves throwing power within the through-hole opening.

The role of electrochemistry of the plating bath provides the greatest area for improvements in the process. Throwing power is defined as the ratio of the hole center copper deposit thickness to its thickness at the surface. For plating high aspect ratio holes in printed circuit boards, this ratio should be greater than about 0.5:1. Optimum throwing power is achieved when the plating current density at the center of the hole is the same as that flowing on the board surface.

It has been discovered, through the use of electrochemical studies, that the plating current density is dependent upon the overpotential, or energy available for electrodepositing copper. Measurement of the overpotential for a particular bath provides a means of controlling the throwing power of the bath and bath composition as the bath ages. Plating additives have a marked effect on charge transfer overpotential and can be used to favorably affect the throwing power.

Conventional prior art baths have not been able to plate high aspect ratio holes in thick printed circuit boards where the requirements are for low operating current densities, exceptional throwing power, bright deposits and excellent mechanical properties of the deposit. The disclosed invention addresses all of these requirements.

SUMMARY OF THE INVENTION

The invention describes an additive for acid copper plating baths used for plating high aspect through-holes in thick printed circuit boards. The additive is chosen for a particular bath based on criteria that the additive must create a minimum charge transfer overpotential shift of at least 150 mV, the charge transfer shift must be independent of agitation of the bath, and also independent of the solution potential at the surface. Alternately, the additive must create a differential overpotential shift whereby the overpotential shift in the hole is less than the overpotential shift on the surface. The additive may be a single component additive or a mixture of components, and comprises one or more wetting agents, brighteners and levelers, provided the above criteria are met. The ratio of the components as mixed, prior to addition to the bath, is pre-determined by criteria based on the overpotential shift. In addition, adjustments to an aging bath with replenishment is made based on changes in the overpotential.

DESCRIPTION OF THE PREFERRED EMBODIMENTS

Figure 1:
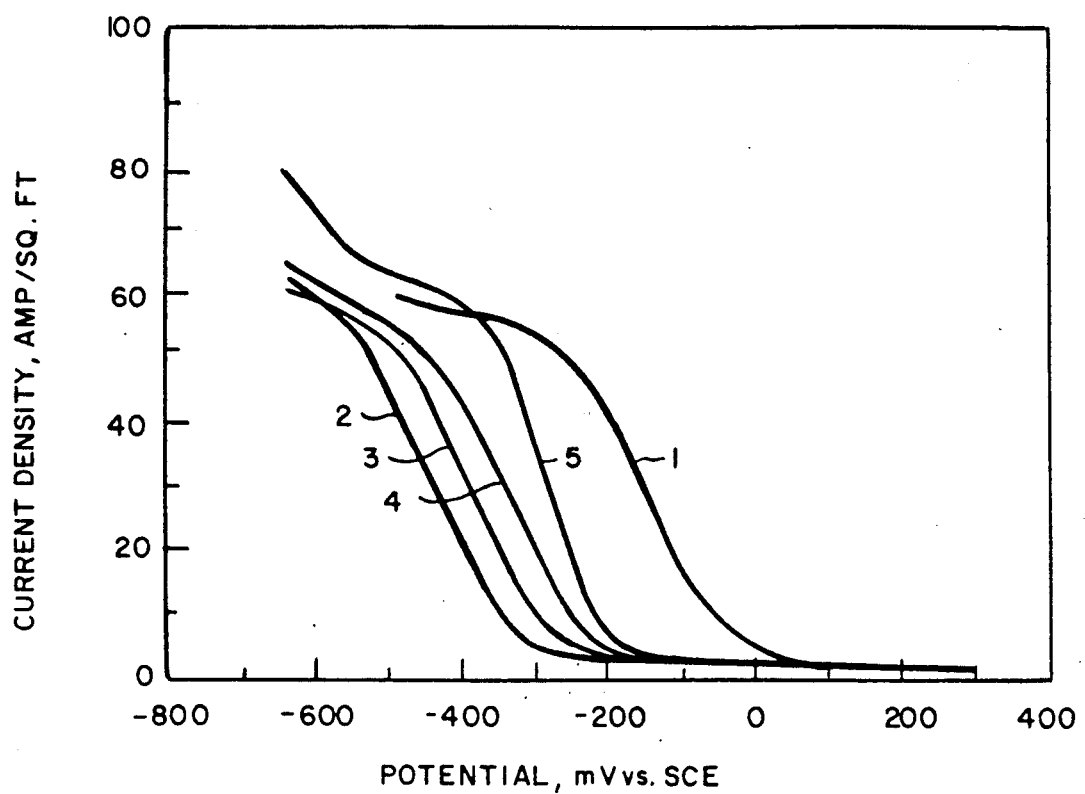
FIG. 1 is a graph of the current density versus potential of the bath when using various wetting agents as the preferred single component additive.

In the fabrication of printed circuits, the starting material is typically a copper clad plastic - i.e., a copper clad epoxy panel. Using subtractive techniques for the fabrication of the board for purposes of illustration, prior to formation of a circuit, conductive through-holes are formed in the board by drilling and metallization. Processes for formation of conductive through-holes are well known in the art and described in numerous publications including U.S. Pat. No. 4,515,829, incorporated herein by reference. Electroless plating procedures may be used to form a first metallic coating over the through-hole wall and electrolytic copper deposition is then used to enhance the thickness of the deposit. Alternatively, electrolytic copper may be plated directly over a suitably prepared through-hole wall as disclosed in U.S. Pat. No. 4,683,036. Processes for electrolessly plating through-holes are not part of this invention.

The next step in the process comprises electroplating copper onto the thus prepared conductive through-hole walls using the electroplating solution, such as that described in copending the patent. A preferred electrolytic copper plating solution in accordance with that invention has the following inorganic composition:

| | |
|---|---|
| copper ions | 3.0 to 8.0 gm/liter |
| sulfuric acid | sufficient for acid to copper ratio of 40:1 to 60:1 |
| chloride ions | 20 to 100 mg/liter |
| water | to 1 liter |

For the ratio defining the acid to copper concentrations, greater latitude is possible at a lower copper content. As the copper (metal) content increases up to a maximum of 10.0 grams per liter of solution, the maximum ratio of acid to copper decreases.

Copper salts suitable for use in the above inorganic acid bath include copper sulfate, copper acetate, copper fluorborate, cupric nitrate and copper pyrophosphate.

In addition to sulfuric acid, other acids may be used in the inorganic bath and include acetic acid, fluoroboric acid, methane sulfonic acid and sulfamic acid.

Base electroplating baths are well known in the art and may be represented by the following composition:

| Copper metal | 5-25 g/l |
|---|---|
| Pyrophosphate | sufficient for a ratio of 7:1 to copper |
| Potassium Hydroxide | 18.0 g/l |

Other bases useful in the bath may be selected from the group consisting of sodium hydroxide and sodium carbonate.

In addition to the components identified above, as is known in the art, other additives are used in the plating solution such as surfactants, brighteners, exaltants, leveling agents, suppressors, etc. Although most of the additives are conventional, various individual additives may either aid or deter the performance characteristics of the bath. This invention uses one or more of the conventional additives to provide a composite additive with overpotential shift requirements.

Electrochemical studies of the addition of wetting agents, levelers and brighteners have led to the development of a composite additive based on producing a minimum overpotential shift in the charge transfer potential. Optimum throwing power is achieved when the plating current density at the center of the hole is the same as that flowing on the board surface. The plating current density is dependent upon the total overpotential, or energy available for electrodepositing copper. Charge transfer overpotential is the energy required to discharge copper ions ($Cu^{+2}$) to metallic copper ($CuO$) onto the conductive substrate. Mass transfer overpotential is energy needed to overcome a concentration gradient due to the hydrodynamic boundary layer of the conductive substrate. When a potential is applied to a circuit board to cause a plating current to flow, the resistance to current flow is different on the surface of the board than in the through-hole. At the surface, the overpotential is resisted by charge transfer potential ($\eta ct$), whose resistance is expressed as ($Rct$) and mass transfer potential ($\eta mt$), whose resistance is expressed as In the hole, the potential is resisted by the same two resistances but also an additional ohmic solution resistance between the surface and hole center ($R_{hole}$).

The throwing power (TP) of the bath, is the ratio of the current flowing at the center of the hole to that flowing at the surface as represented in the following equations:

$$TP = \frac{I_h}{I_s}$$

or:

$$TP = \frac{(R_{ct} + R_{mt})s}{(R_{ct} + R_{mt} + R_{hole})h}$$

Plating additives have a marked effect on the charge transfer overpotential and can be used to favorably affect the throwing power. One of the objects of this invention was to select a composite additive based on the additive creating an overpotential shift in the hole which is less than the overpotential shift on the surface. This is accomplished by either a potential or agitation interaction of the additive with the system. When the wetting agent adsorbs more strongly in the higher potential areas (on the surface as opposed to the hole), the charge transfer resistance generally increases or slows the reaction down on the surface because the adsorbed layer of the additive is thicker. When the brightener, or more specifically, the brightener breakdown products adsorb more strongly at the lower potential (inside the hole), the charge transfer potential decreases, thereby increasing the current density in the hole as opposed to the surface. Both of these type interactions between the additive and potential will increase the throwing power of the bath and result in improved plating in the through-holes.

A one component additive useful in the practice of this invention would include wetting agents such as polyethylene oxides (mol. wt. 300,000 to 4 million), polyoxyalkylene glycols, block copolymers of polyoxyalkylenes, polyalkylene glycols, alkylpolyether sulfonates; complexing surfactants such as alkoxylated diamines, ethoxylated amines, polyoxyalkylene amines; and complexing agents for cupric or cuprous ions which include entprol, citric acid, edetic acid, tartaric acid, potassium sodium tartrate, acetonitrile, cupreine and pyridine. The most preferred wetting agent is an alkoxylated diamine. The amount used to formulate the additive is normally in the range of 100-10,000 ppm based on the weight of the bath.

The choice of brighteners to be added to the wetting agent to make a two component additive may be chosen from the group including n,n-dimethyl-dithiocarbamic acid-(3-sulfopropyl)ester, 3-mercapto-propylsulfonic acid (sodium salt), carbonic acid-dithio-o-ethylester-s-ester with 3-mercapto-1-propane sulfonic acid (potassium salt), bissulfopropyl disulfide, 3-(benzthiazolyl-s-thio)propyl sulfonic acid (sodium salt), pyridinium propyl sulfobetaine, or combinations of two of the above. The most preferred brightener is n,n-dimethyl-dithiocarbamic acid-(3-sulfopropyl)-ester. Brighteners are added in the range of 0.010 to 3.0 ppm based on the weight of the bath.

Levelers may also be added to make a three component additive and are chosen from the group including 1-(2-hydroxyethyl)-2-imidazolidinethione, 4-mercaptopyridine, 2-mercaptothiazoline, ethylene thiourea, thiourea, or alkylated polyalkyleneimine and are added in the range of 0.1-3 ppm. The most preferred leveler is 1-(2-hydroxyethyl)-2-imidazolidinethione.

The plating solutions of this invention are used in conventional manner. They are preferably used at room temperature, but may be used at elevated temperatures up to and somewhat above 650° C. In use, the plating solution is preferably used with solution agitation. This may be accomplished in a variety of ways including an air sparger, work piece agitation or by impingement. Plating is preferably conducted at a current ranging between 1 and 40 amps per square foot (ASF) depending upon the board aspect ratio and thickness. Plating time is normally 27 minutes for a 1 mil thickness when plated at 40 ASF.

The following examples show how the additives of the present invention were tested to see if they meet the necessary criteria of improving the throwing power of the bath by creating a change in the charge transfer overpotential shift; and are not to be taken as limitations to the practice of the invention.

The plating solution in all of the examples contains the following inorganic components:

| | |
|---|---|
| copper sulfate pentahydrate | 30 gm/liter |
| sulfuric acid | 300 gm/liter |
| chloride | 25 ppm |
| deionized water | to 1 liter |

The above bath corresponds to one having a hydrogen ion content (expressed as sulfuric acid) to copper metal content of 40 to 1 with a dissolved copper metal (cupric ion) content of 7.5 grams per liter of solution.

Measurements were made using a Model 273 Potientiostat, manufactured by Princeton Applied Research, with a 1 amp maximum, used in conjunction with a Pine rotator with a maximum speed of 6,400 rpm, utilizing a 0.156 inch diameter platinum disk. The use of a potentiostat allows for measurement of both the potential and current density. Plots are then made of the potential versus the current density of the particular bath measured.

EXAMPLE 1

In order to determine if individual additives were useful as a single or multi-component additive, portions of the inorganic bath were removed and placed in separate beakers. The tip of a reference calomel electrode is placed one-half inch from the platinum disk (cathode or working electrode) of the Pine rotator, and the speed is held constant at 500 rpm. A copper anode is placed in the beaker at a distance of one inch from the working electrode, with both electrodes being placed at the same depth. The voltage is set at 1.6 volts for 5-10 seconds to clean the disk. The potentiostat is set to scan from 200 to −800 mV versus Saturated Calomel Electrode (SCE), at a rate of 10 mV/second and the data is automatically recorded. Plots are then made of the current density versus potential for each additive to be tested. A control solution (inorganics only) is always measured first. The overpotential shift is measured at a point on which the curves are parallel (approximately 20 ASF) and the distance between the curves is read on the potential scale to determine the amount of shift created by the additive. A minimum overpotential shift of 150 mV is required for an acceptable additive.

The overpotential shift as a function of the type of wetting agent used in an optimized conventional acid-copper bath is depicted in FIG. 1. All wetting agents were added at a level of 1000 ppm. Curve 1 represents the bath with only inorganic components and no additive. Curves 2-5 represent various wetting agents added to the bath including an alkoxylated diamine (2), a polyethylene oxide (3), an amine (4), and a polypropylene glycol (5).

EXAMPLE 2

Figure 2:
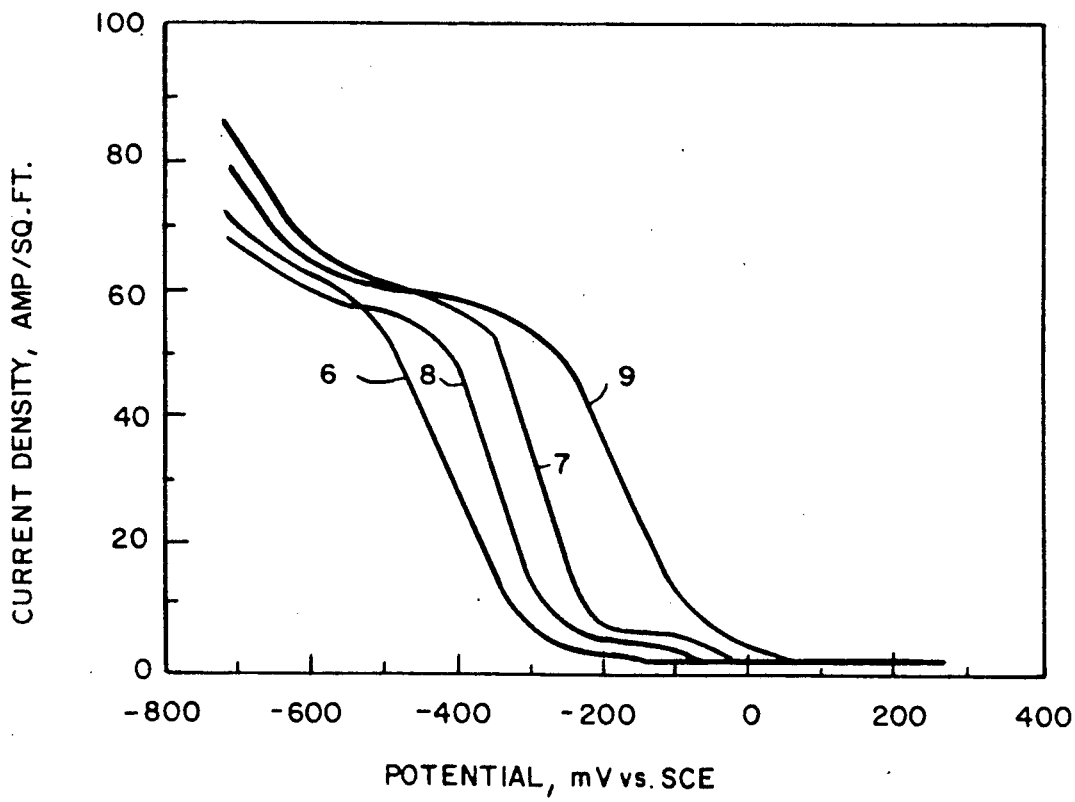
FIG. 2 is a graph of the current density versus potential of the bath when using no additive, a one component additive, two component additive and three component additive.

The same procedure used in Example 1 was used to determine the overpotential shift for a two and three component additive, where brighteners and levelers are combined with a wetting agent. As brighteners and levelers are made components of the additive, the shift in the overpotential changes as does the throwing power. FIG. 2 shows the overpotential shift in the plating bath as effected by a one component additive (6), a two component additive (7), and a three component additive (8). Curve 9 represents the overpotential shift as measured with no additives. As brightener and leveler components are added to the bath with the wetting agent, they affect the amount of the shift. A one component additive (wetting agent) has a greater shift than a three component additive (wetting agent, brightener and leveler), which in turn has a greater shift than a two component additive (wetting agent and brightener).

The solutions of the invention are especially designed for the plating of through-holes in printed circuit manufacture where the through-hole has an aspect ratio greater than 10 to 1 and a length of 0.100 inches, preferably 0.150 inches or more. Prior to deposition of electrolytic copper onto the through-hole wall, the circuit board including the through-hole, is made conductive by conventional electroless copper deposition methods. Electroless copper deposition does not constitute a part of this invention. Deposition of copper from the solution of the present invention onto the wall of the through-hole results in a deposit that is uniformly thick over the full length of the hole and is characterized by excellent elongation and solder shock properties.

The following examples show how determinations of the throwing power of acid-copper baths and the additive of the disclosed invention were made by plating high aspect ratio holes drilled in FR-4 epoxy multilayer circuit boards. The boards Were 0.230 inches thick with holes 0.013 inches in diameter (aspect ratio—18:1). They were prepared for electroplating by using a standard permanganate desmear process such as the one disclosed in U.S. Pat. No. 4,515,829. An electroless copper deposit of 0.06-0.08 mil thickness was then coated on the substrate by a conventional electroless process such as disclosed in U.S. Pat. No. 3,765,936. Small coupons, 1"×2", taken from each board were mounted in the central opening of a 4"×8" piece of copper clad laminate and plated in an 18 gallon tank with air and cathode movement agitation. After plating, cross-sectional samples were prepared for metallographic examination to determine throwing power, current density, leveling and deposit quality.

EXAMPLE 3

Figure 3:
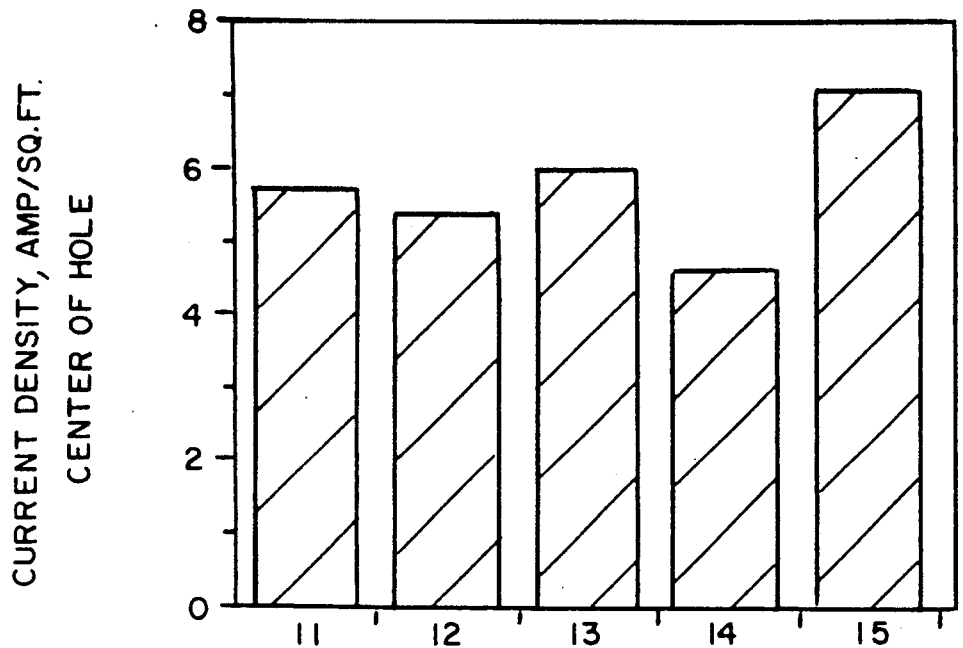
FIG. 3 a bar graph depiction of the change in hole current density of the bath, as measured using a high aspect ratio circuit board, using various wetting agents as the preferred single component additive.

The inorganic components of the plating bath were the same as described in Example 1. The plating bath was operated at a temperature of 26° C., 5.3 applied amps, for 3 hours. FIG. 3 shows the hole center current density as a function of the additive of the present invention. A bar graph is used to show the current density at the center of the hole plotted against various one component additives. The current density when using a high molecular weight block copolymer of two polyoxyalkylenes is show as (11). Other preferred additives graphed include a polyethylene oxide (12), an alkylpolyether sulfonate (sodium salt) (13), a low molecular weight polyalkylene glycol (14), and the most preferred additive, an alkoxylated diamine (15). All additives were added at a level of 1,000 ppm.

EXAMPLE 4

Figure 4:
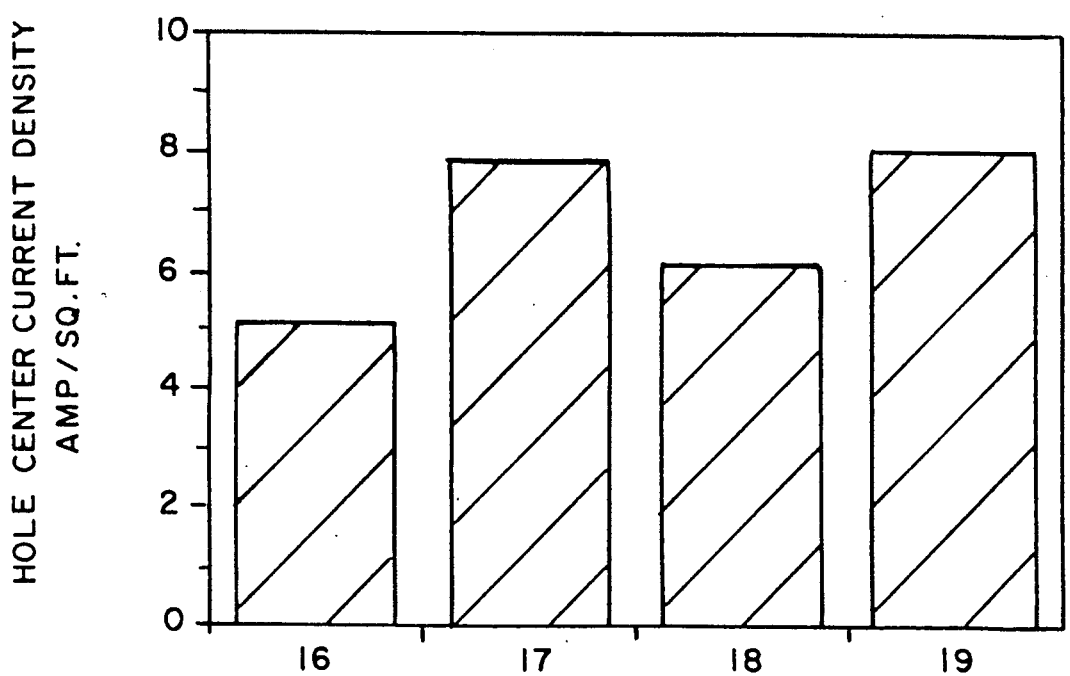
FIG. 4 is a bar graph depiction of the change in hole current density of the bath, as measure using a high aspect ratio circuit board, using no additive, a one component additive, a two component additive and a three component additive.

The inorganic components of the plating bath were the same as described in Example 1. The plating bath was operated at a temperature of 26° C., 7.1 applied amps, for 3 hours. FIG. 4 shows the hole center current density as a function of the additive composition. Bar graph depictions show the bath with no additive (16), an alkoxylated diamine (1,000 ppm) as the preferred wetting agent in a one component additive (17), the addition of 3 ppm of n,n-dimethyl-dithiocarbamic acid-(3-sulfopropyl)-ester as a brightener to make a two component additive (18), and the addition of 2.4 ppm of 1-(2-hydroxyethyl)-2-imidazolidinethione as a leveler to make a three component additive (19).

Examination of the deposit quality showed that the use of a one component additive (wetting agent) resulted in a matte pink color deposit with some minor roughness depending on the precleaning technique, even though physical properties were excellent. The addition of a two or three component additive (leveler and brightener) gave a finished mirror bright deposit with a smooth ductile appearance.

Figure 5:
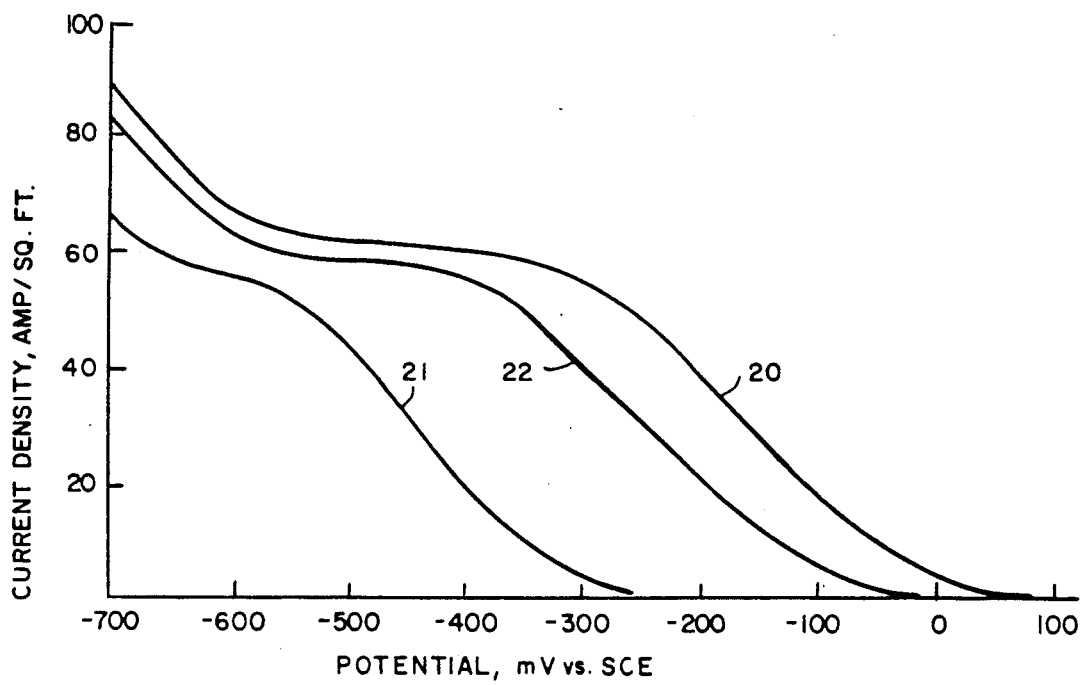
FIG. 5 is a graph of the current density versus potential of the bath as it changes over time with the addition of a three component additive.

By measuring the overpotential of the bath and knowing the overpotential shift created by certain additives, it is possible to control the amount and type of replenishment that should be added to the bath to keep it functioning at optimum throwing power. As the bath decomposes, the decomposition products formed in the bath also affect the overpotential. FIG. 5 shows a plot of the current density in ASF against the measured overpotential of the bath in mV versus SCE. Curve (20) represents the conventional inorganic bath of Example 1 with no additive. The addition of a three component additive (wetting agent, brightener, and leveler) creates a shift in the overpotential of approximately 300 mV at time zero (curve 21). As the bath ages and byproducts are formed, the shift decreases (curve 22) and the bath loses throwing power.

Figure 6:
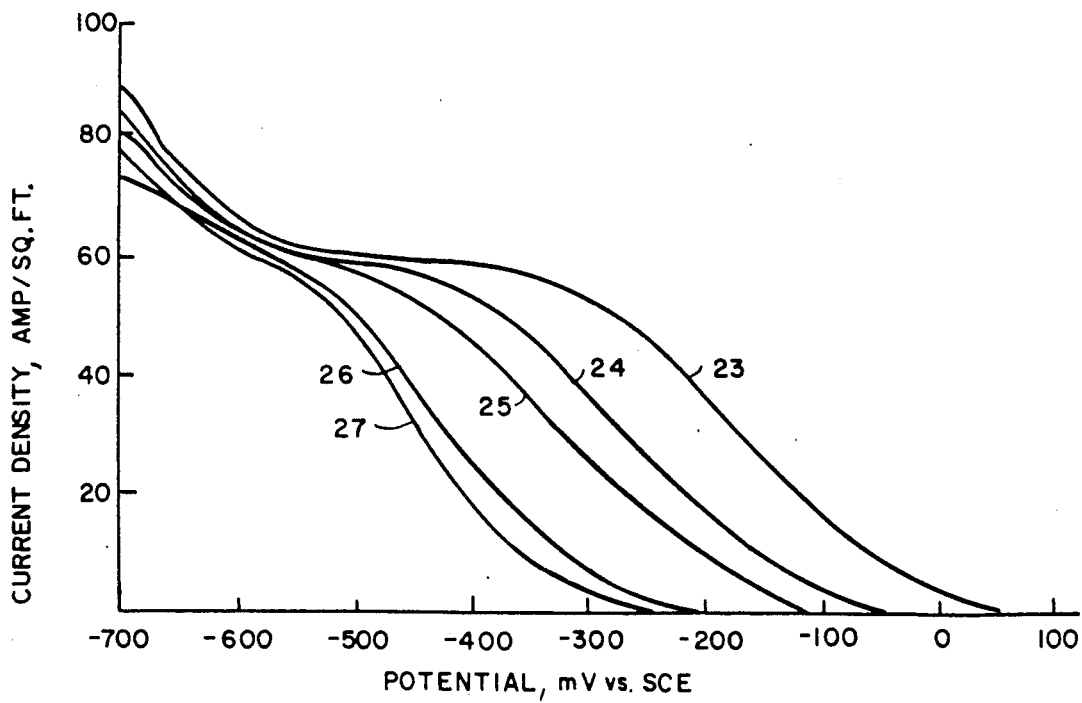
FIG. 6 is a graph of the current density versus potential of the bath with the addition of a two component additive and changes that occur - breakdown of one component.

The same type effect is seen in FIG. 6 where a two component additive (wetting agent and brightener) is added to the conventional inorganic bath of Example 1 (curve 23). By plotting current density in ASF against overpotential of the bath in mV versus SCE, it was found that the original additive (curve 24), which contained a high amount of brightener, had an overpotential shift of approximately 100 mV. As the amount of brightener decreases (i.e. brightener by-products increase), the overpotential shift increases as seen in curves 25 - 27, thus throwing power of the bath also increases.

The best mode contemplated by the invention comprises the inorganic plating solution described in Example 1 with a three component additive having the following composition:

| | |
|---|---|
| alkoxylated diamine | 1,000 ppm |
| n,n-dimethyl-dithiocarbamic acid-(3-sulfopropyl)-ester | 3 ppm |
| 1-(2-hydroxyethyl)-2-imidiazolidinethione | 2.4 ppm |

The throwing power as measured by the hole center current density was approximately 8.2 ASF. The deposit formed using this additive was uniform and mirror bright with a smooth ductile appearance.

What is claimed is:

1. An aqueous electroplating solution, comprising:
   at least one soluble copper salt, an electrolyte,
   at least one organic additive capable of modifying the charge transfer overpotential of said solution in an amount sufficient to shift said overpotential by at least 150 millivolts, said shift being independent of solution agitation.

2. The composition of claim 1 wherein said soluble copper salt is selected from the group consisting of copper sulfate, copper acetate, copper fluorborate, cupric nitrate and copper pyrophosphate.

3. The composition of claim 1 wherein said soluble copper salt is copper sulfate.

4. The composition of claim 1 wherein said electrolyte is an acid used in combination with halide ions.

5. The composition of claim 4 wherein said acid is selected from the group consisting of sulfuric acid, acetic acid, fluoboric acid, methane sulfonic acid and sulfamic acid.

6. The composition of claim 4 wherein said acid is sulfuric acid.

7. The composition of claim 4 wherein said halide ion is chloride.

8. An aqueous electroplating solution, comprising:
   at least one soluble copper salt, a base and at least a one component organic additive capable of modifying the charge transfer overpotential of said solution in an amount sufficient to shift said overpotential by at least 150 millivolts, said shift being independent of solution agitation.

9. The composition of claim 8 wherein said base is selected from the group consisting of sodium hydroxide, potassium hydroxide and sodium carbonate, 10. The composition of claim 8 wherein said base is sodium hydroxide.

11. The composition of claim 1 wherein said additive is selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine.

12. The composition of claim 1 wherein said one component additive is an alkoxylated diamine.

13. The composition of claim 1 wherein said one component additive is present in an amount in the range of 100–10,000 ppm.

14. The composition of claim 1 wherein said additive is selected from the group consisting of polyethylene oxides (mol. wt. 300,000 to 4 million), polyoxyalkylene glycols, copolymers of polyoxyalkylene glycols, polyoxyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine, pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bissulfopropyl disulfide, 3-(benzthiazolyl-4-thio)propyl sulfonic acid (sodium salt), pyridinium propyl sulfobetaine or mixtures thereof.

15. The composition of claim 1 wherein said second component is n,n-dimethyl-dithiocarbamic acid-(3-sulfopropyl)-ester.

16. The composition of claim 1 wherein said second component is present in an amount in the range of 0.010 to 3.0 ppm.

17. The composition of claim 1 wherein said selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine, pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3- mercapto-1-propane sulfonic acid (potassium salt), bissulfopropyl disulfide, 3-(benzthiazolyl-5-thio)propyl sulfonic acid (sodium salt), pyridinium propyl sulfobetaine, 1-(2-hydroxyethyl)-2-imidazolidine-thione, 4-mercaptopyridine, 2-mercaptothiazoline, ethylene thiourea, thiourea, alkylate polyalkyleneimine or mixtures thereof.

18. The composition of claim 17 wherein said third component is 1-(2-hydroxyethyl)-2-imidazolidinethione.

19. The composition of claim 17 wherein said third component is present in an amount in the range of 0.1 to 3.0 ppm.

20. An aqueous electroplating composition for plating surfaces having recesses or perforations with a diameter to length ratio in excess of ten to one, comprising:
at least one soluble copper salt, an electrolyte,
at least one organic additive capable of modifying the charge transfer overpotential of said composition in an amount sufficient to shift said overpotential by at least 150 millivolts, said shift being independent of solution agitation.

21. The composition of claim 20 wherein said soluble copper salt is selected from the group consisting of copper sulfate, cupric acetate, copper fluorborate, cupric nitrate and copper pyrophosphate.

22. The composition of claim 20 wherein said soluble copper salt is copper sulfate.

23. The composition of claim 20 wherein said electrolyte is an acid used inc combination with halide ions.

24. The composition of claim 23 wherein said acid is selected from the group consisting of sulfuric acid, acetic acid, fluoboric acid, methane sulfonic acid and sulfamic acid.

25. The composition of claim 23 wherein said acid is sulfuric acid.

26. The composition of claim 23 wherein said halide ion is chloride.

27. An aqueous electroplating solution, comprising:
at least one soluble copper salt, a base and at least a one component organic additive capable of modifying the charge transfer overpotential of said composition in an amount sufficient to shift said overpotential by at least 150 millivolts, said shift being independent of solution agitation.

28. The composition of claim 27 wherein said base is selected from the group consisting of sodium hydroxide, potassium hydroxide and sodium carbonate.

29. The composition of claim 28 wherein said base is sodium hydroxide.

30. The composition of claim 20 wherein said additive is selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine.

31. The composition of claim 20 wherein said one component additive is an alkoxylated diamine.

32. The composition of claim 20 wherein said one component additive is present in an amount in the range of 100-10,000 ppm.

33. The composition of claim 20 wherein said from the group consisting of a one component additive selected from the group consisting of polyethylene oxides (mol. wt. 300,000 to 4 million), polyoxyalkylene glycols, copolymers of polyoxyalkylene glycols, polyoxyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bissulfopropyl disulfide, 3-(benzthiazolyl-5-thio)propyl sulfonic acid (sodium salt), pyridinium propyl sulfobetaine or mixtures thereof.

34. The composition of claim 20 wherein said second component is n,n-dimethyl-dithiocarbamic acid-(3-sulfopropyl)-ester.

35. The composition of claim 20 wherein said second component is present in an amount in the range of 0.010 to 3.0 ppm.

36. The composition of claim 1 wherein said additive is selected from the group from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine, pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bissulfopropyl disulfide, 3-(benzthiazolyl-5-thio)propyl sulfonic acid (sodium salt), pyridinium propyl sulfobetaine; 1-(2-hydroxyethyl)-2-imidazolidinethione, 4-mercaptopyridine, 2-mercaptothiazoline, ethylene thiourea, thiourea, alkylate polyalkyleneimine or mixtures thereof.

37. The composition of claim 36 wherein said third component is 1-(2-hydroxyethyl)-2-imidazolidinethione.

38. The composition of claim 36 wherein said third component is present in an amount in the range of 0.1 to 3.0 ppm.

39. An aqueous electroplating composition for plating surfaces having recesses or perforations with a diameter to length ratio in excess of ten to one, comprising:
at least one soluble copper salt; an electrolyte; and
at least one organic additive capable of modifying the charge transfer overpotential of said composition in an amount whereby the ratio of the shift in overpotential at the surface to the shift in overpotential within the recesses or perforations is greater than one.

40. The composition of claim 39 wherein said soluble copper salt is selected from the group consisting of copper sulfate, cupric acetate, copper fluorborate, cupric nitrate and copper pyrophosphate.

41. The composition of claim 39 wherein said soluble copper salt is copper sulfate.

42. The composition of claim 39 wherein said electrolyte is an acid used in combination with halide ions.

43. The composition of claim 42 wherein said acid is selected from the group consisting of sulfuric acid, acetic acid, fluoboric acid, methane sulfonic acid and sulfamic acid.

44. The composition of claim 42 wherein said acid is sulfuric acid.

45. The composition of claim 42 wherein said halide ion is chloride.

46. An aqueous electroplating solution, comprising:
at least one soluble copper salt, a base and at least a one component organic additive capable of modifying the charge transfer overpotential of said composition in an amount whereby the ratio of the shift in overpotential at the surface to the shift in overpotential within the recesses or perforations is greater than one.

47. The composition of claim 46 wherein said base is selected from the group consisting of sodium hydroxide, potassium hydroxide and sodium carbonate.

48. The composition of claim 46 wherein said base is sodium hydroxide.

49. The composition of claim 39 wherein said additive is selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine.

50. The composition of claim 39 wherein said one component additive is an alkoxylated diamine.

51. The composition of claim 39 wherein said one component additive is present in an amount in the range of 100–10,000 ppm.

52. The composition of claim 39 wherein said additive is selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine, pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bissulfopropyl disulfide, 3-(benzthiazolyl-5-thio)propyl sulfonic acid (sodium salt), pyridinium propyl sulfobetaine or mixtures thereof.

53. The composition of claim 39 wherein said second component is n,n-dimethyl-dithiocarbamic acid-(3-sulfopropyl)-ester.

54. The composition of claim 39 wherein said second component is present in an amount in the range of 0.010 to 3.0 ppm.

55. The composition of claim 1 wherein said additive is selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine, pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bissulfopropyl disulfide, 3-(benzthiazolyl-5-thio)propyl sulfonic acid (sodium salt), and pyridinium propyl sulfobetaine, 1-(2-hydroxyethyl)-2-imidazolidinethione, 4-mercaptopyridine, 2-mercaptothiazoline, ethylene thiourea, thiourea, alkylate polyalkyleneimine or mixtures thereof.

56. The composition of claim 55 wherein said third component is 1-(2-hydroxyethyl)-2-imidazolidinethione.

57. The composition of claim 55 wherein said third component is present in an amount in the range of 0.1 to 3.0 ppm.

58. A method for formulating an electroplating bath, said method comprising the steps of:
providing a copper salt dissolved in an electrolyte;
selecting an additive group consisting of polyethylene oxides (mol. wt. 300,000 to 4 million), polyoxyalkylene glycols, copolymers of polyoxyalkylene glycols, polyalkylene glycols, alkylpolyether sulfonates, ethoxylated diamines, dialkoxylated amines, ethoxylated amines, polyoxyalkylene amines, entprol, citric acid, edetic acid, tartaric acid, potassium sodium tartrate, acetonitrile, cupreine pyridine, n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bis-sulfopropyl disulfide, 3-(benzthiazolyl-5-thio)propyl sulfonic acid (sodium salt), and pyridinium propyl sulfobetaine, 1-(2-hydroxyethyl)-2-imidazolidinethione, 4-mercaptopyridine, 2-mercaptothiazoline, ethylene thiourea, thiourea, alkylate polyalkyleneimine or mixtures thereof;
adjusting the amount of said additive whereby said additive provides an overpotential shift of at least 150 millivolts in said bath; and
adding said additive to said bath.

59. A method for electroplating the walls of a through-hole in a printed circuit board where the aspect ratio of said through-hole is greater than 10 to 1, said method comprising the steps of:
providing a copper salt dissolved in an electrolyte;
selecting at least a one component additive selected from the group consisting of:
a first component, selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine;
second component selected from the group consisting of n,n-dimethyl-dithiocarbamic acid-(3-sulfopropyl)-ester, 3-mercapto-propylsulfonic acid (sodium salt), carbonic acid-dithio-o-ethylester-5-ester with 3-mercapto-1-propane sulfonic acid (potassium salt), bis-sulfopropyl disulfide, 3-(benzthiazolyl-5-thio)propyl sulfonic acid (sodium salt), and pyridinium propyl sulfobetaine; and third component selected from the group consisting of 1-(2-hydroxyethyl)-2-imidazolidinethione, 4-mercaptopyridine, 2-mercaptothiazoline, ethylene thiourea, thiourea, alkylate polyalkyleneimine or mixtures thereof;
adjusting the amount of said additive whereby said additive provides an overpotential shift of a least 150 millivolts in said bath; and
adding said additive to said bath.

60. A method for electroplating the walls of a through-hole in a printed circuit board where the aspect ratio of said through-hole is greater than 10 to 1, said method comprising the steps of:

providing a copper salt dissolved in an electrolyte;
selecting an additive selected from the group consisting of polyethylene oxides (mol. wt. 300,000 to 4 million), polyoxyalkylene glycols, copolymers of polyoxyalkylene glycols, polyalkylene glycols, alkylpolyether sulfonates, alkoxylated diamines, dialkoxylated amines, ethoxylated amines, polyoxyalkylene amines, entprol, citric acid, edetic acid, tartaric acid, potassium sodium tartrate, acetonitrile, cupreine and pyridine, n,n-dimethyl-dithiocarbamic acid-(3-sulfopropyl)-ester, 3-mercaptopropylsulfonic acid (sodium salt), carbonic acid-dithio-o-ethylester-5-ester with 3-mercapto-1-propane sulfonic acid (potassium salt), bis-sulfopropyl disulfide, 3-(benzthiazolyl-5-thio)propyl sulfonic acid (sodium salt), and pyridinium propyl sulfobetaine, 1-(2-hydroxyethyl)-2-imidazolidinethione, 4-mercaptopyridine, 2-mercaptothiazoline, ethylene thiourea, thiourea, alkylate polyalkylene imine or mixtures thereof;

adjusting the amount of said additive whereby said additive provides a ratio, or shift in overpotential at the surface to shift in overpotential within the through-hole, greater than one; and adding said additive to said bath.

* * * * *